(12) United States Patent
Guth et al.

(10) Patent No.: US 8,104,667 B2
(45) Date of Patent: Jan. 31, 2012

(54) METHOD FOR CONNECTING A COMPONENT WITH A SUBSTRATE

(75) Inventors: Karsten Guth, Soest (DE); Aldred Kemper, Warstein (DE); Roland Speckels, Kamen (DE)

(73) Assignee: Infineon Technologies AG, Munich (DE)

( * ) Notice: Subject to any disclaimer, the term of this patent is extended or adjusted under 35 U.S.C. 154(b) by 9 days.

(21) Appl. No.: 12/844,170

(22) Filed: Jul. 27, 2010

(65) Prior Publication Data

US 2011/0017803 A1    Jan. 27, 2011

Related U.S. Application Data

(62) Division of application No. 11/688,039, filed on Mar. 19, 2007, now Pat. No. 7,793,819.

(51) Int. Cl.
*B23K 20/00* (2006.01)
(52) U.S. Cl. ............... 228/193; 226/4.1; 226/6.2
(58) Field of Classification Search ............ 228/193, 228/194, 44.3, 262.1, 227, 228, 4.1, 6.2; 428/516, 615; 156/286, 285, 382
See application file for complete search history.

(56) References Cited

U.S. PATENT DOCUMENTS

| 4,886,449 | A | * | 12/1989 | Brittin | 432/121 |
| 5,029,383 | A | * | 7/1991 | Snyder et al. | 29/740 |
| 5,259,546 | A | * | 11/1993 | Volk | 228/102 |
| 5,433,368 | A | * | 7/1995 | Spigarelli | 228/8 |
| 7,268,430 | B2 | * | 9/2007 | Suga et al. | 257/737 |
| 7,793,819 | B2 | * | 9/2010 | Guth et al. | 228/193 |
| 2006/0273450 | A1 | * | 12/2006 | Shi et al. | 257/706 |

* cited by examiner

*Primary Examiner* — Scott Kastler
*Assistant Examiner* — Michael Aboagye
(74) *Attorney, Agent, or Firm* — Coats & Bennett, P.L.L.C.

(57) ABSTRACT

An apparatus for connecting a component with a substrate by means of diffusion soldering in a closed evacuated chamber, wherein the component and the substrate to be connected are displaceable separate from one another in the chamber, and the chamber comprises a combined transfer and pressing unit being displaceable between a current position of the component and a current position of the substrate, for placing and pressing the component on the substrate, and the combined transfer and pressing unit comprises a rotatable element, which, in response to the placing and pressing of the component on the substrate, assumes an angle between the normal of a lower side of the component to be connected and a pressing direction of the component, the angle corresponding to an angle between the normal of a surface area of the substrate to be connected and the pressing direction of the component.

20 Claims, 5 Drawing Sheets

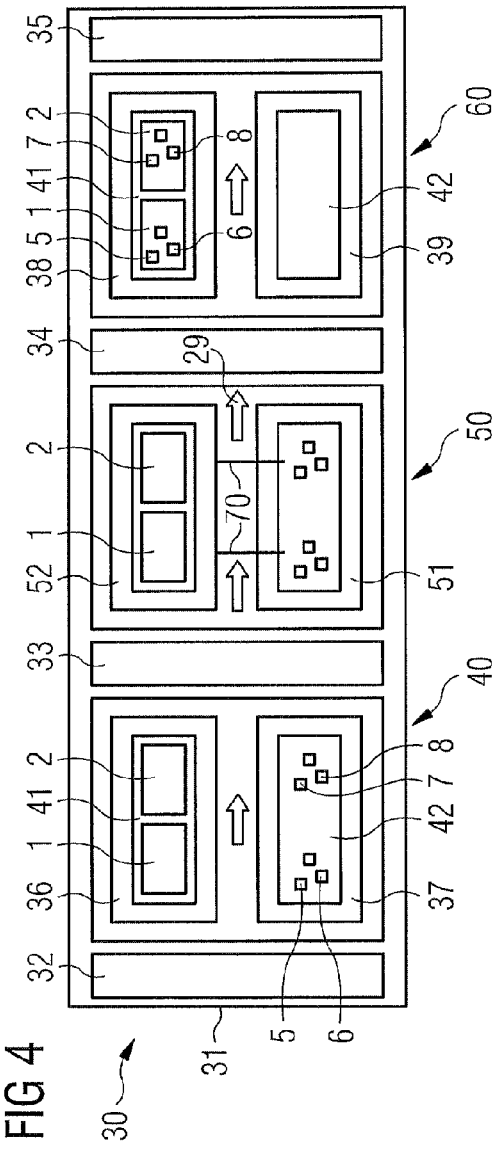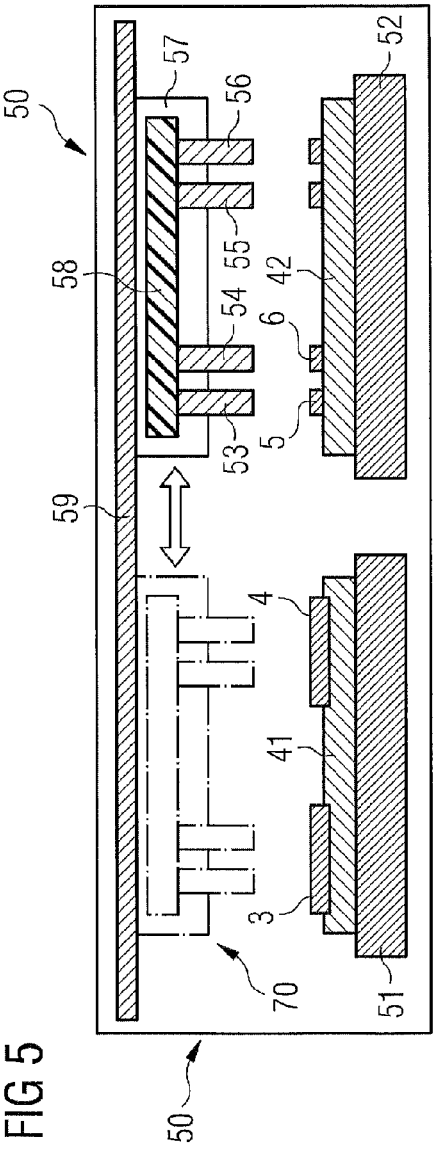

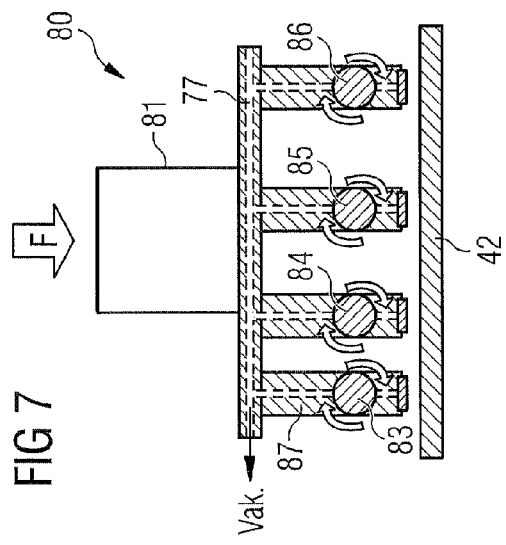
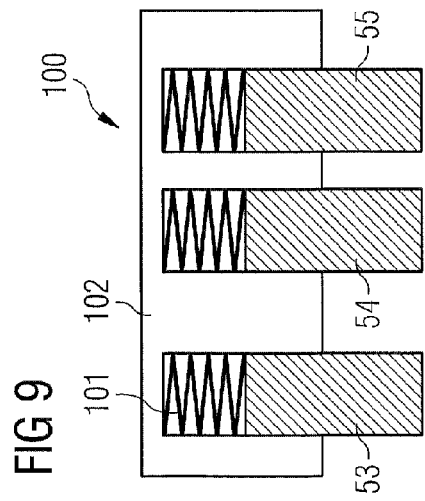
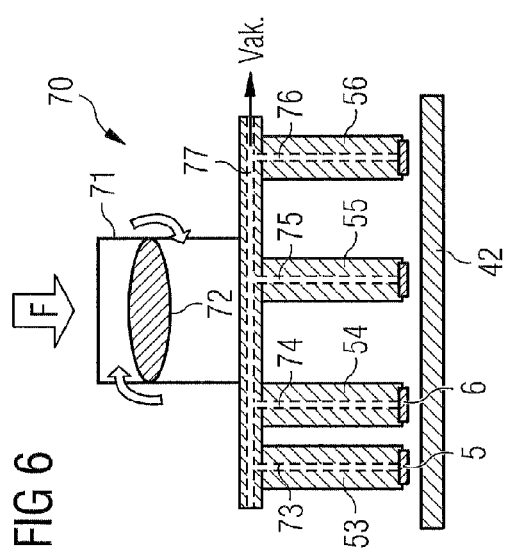
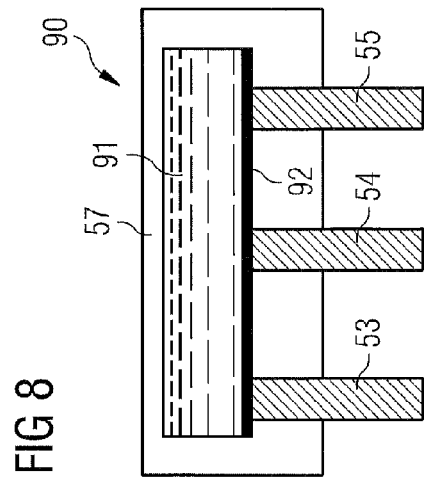

FIG 13
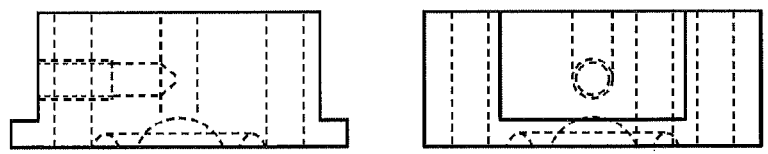
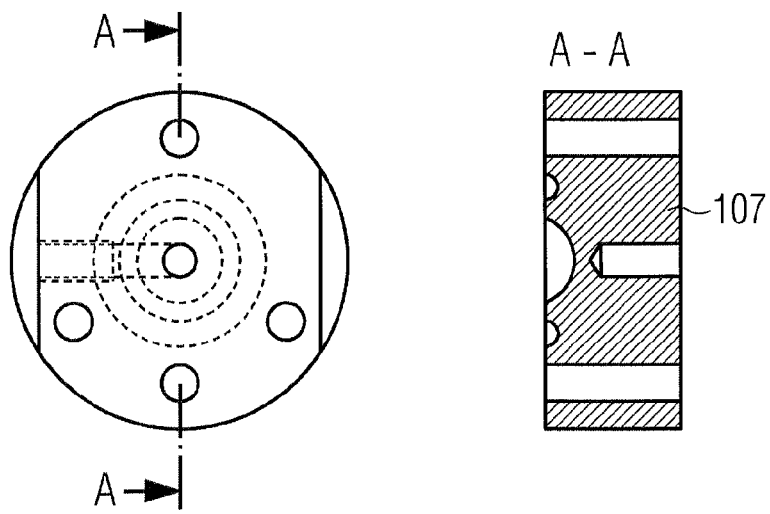
FIG 14
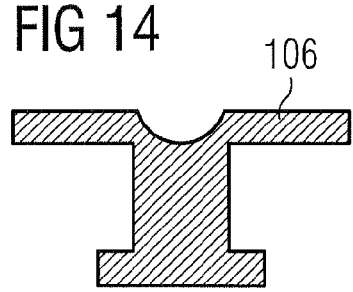
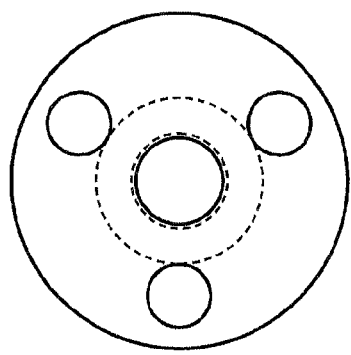

METHOD FOR CONNECTING A COMPONENT WITH A SUBSTRATE

PRIORITY CLAIM

This application is a divisional of, and claims priority to, U.S. application Ser. No. 11/688,039 filed 19 Mar. 2007, now U.S. Pat. No. 7,793,819, the content of which application is incorporated herein by reference in its entirety.

FIELD OF THE INVENTION

The present invention relates to an apparatus and method for connecting a component to a substrate by means of diffusion soldering in a chamber.

BACKGROUND

Electronic modules comprise power electronic circuits, such as inverters and rectifiers, for example. Often, a plurality of substrates is arranged on a metal base plate and integrated into a module. Metallization layers are likewise deposited on the front side (e.g. a structured layer) and the rear side of the substrates so as to connect semiconductor devices and components to the front side and the metallic base plate to the rear side of the substrate by means of soft-soldering via solder layers.

In a soft-soldering process, a solder paste is applied to the substrates by means of template printing or ink jet methods. Subsequently, the devices are placed on the solder paste surfaces. The fitted substrates are automatically transported in a soldering furnace (vacuum continuous furnace, batch furnace, vapor-phase oven, etc.). There, heat is introduced into the substrates and the solder is remelted.

Diffusion soldering provides an alternative technology to soft-soldering. During diffusion soldering, a common soft solder is used, whereby, contrary to the paste-soldering, the target layer thickness is reduced. A common heating channel may be used for diffusion soldering of semiconductor devices, which are inserted into the heating channel through an opening. The devices are soldered in an open heating channel such that a flowing forming and protective gas atmosphere and a contact pressure are present for a period of time. The heating channel is divided into three sections. For a homogeneous flow of the protective gas and for minimizing a contamination of the protective gas flow through the opening the surface of the opening is rather small so that the discharge of the protective gas only slightly disrupts the homogeneous flow of the protective gas.

The open heating channels do not provide an opportunity to use aggressive media as an activating atmosphere for the reduction of oxidized surfaces of the devices. Thus, there is a need to provide channels allowing the use of aggressive media.

SUMMARY

An apparatus for connecting a component with a substrate by means of diffusion soldering in a closed evacuated chamber, where the component and the substrate to be connected are displaceable separate from one another in the chamber, and the chamber comprises a combined transfer and pressing unit being displaceable between a current position of the component and a current position of the substrate, for placing and pressing the component on the substrate, and the combined transfer and pressing unit comprises a rotatable element, which, in response to the placing and pressing of the component on the substrate, assumes an angle between the normal of a lower side of the component to be connected and a pressing direction of the component, the angle corresponding to an angle between the normal of a surface area of the substrate to be connected and the pressing direction of the component.

Those skilled in the art will recognize additional features and advantages upon reading the following detailed description, and upon viewing the accompanying drawings.

BRIEF DESCRIPTION OF THE DRAWINGS

The novel connection arrangement can be better understood with reference to the following drawings and description. The components in the figures are not necessarily to scale, instead emphasis is placed upon illustrating the principles of the novel arrangement. Moreover, in the figures, like reference numerals designate corresponding parts. In the drawings:

FIG. 4 is a top view of an example of a novel apparatus for diffusion soldering with three subchambers;

FIG. 5 is a cross sectional view of a novel chamber for diffusion soldering in another example with a transfer and pressing unit having plunges, which are elastically connected to one another;

FIG. 6 is a cross sectional view of a transfer and pressing unit with plunges, which prevent tiltings between components and substrates via a shared rotatable element;

FIG. 7 is a cross sectional view of a transfer and pressing unit in another example, whereby each plunge comprises an individual rotatable element;

FIG. 8 is a cross sectional view of a transfer and pressing unit in yet another example, whereby the plunges are connected to one another over an elastic cell comprising a liquid and of a membrane, which seals the liquid;

FIG. 9 is a cross sectional view of a transfer and pressing unit in an example, whereby each plunge is connected to the plunge carrier in an individually movable and spring-mounted manner;

FIG. 13 is a schematic view of the lower part of FIG. 12; and

FIG. 14 is a schematic view of the upper part of FIG. 12.

DETAILED DESCRIPTION

Figure 1:
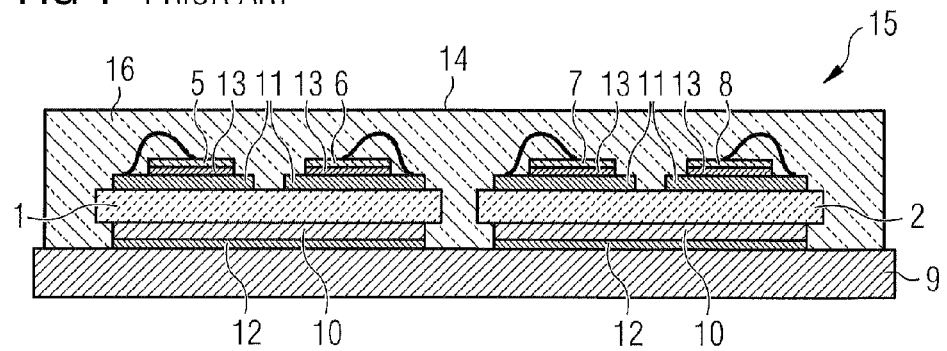
FIG. 1 is a cross sectional view of a power semiconductor module with electronic components on two substrates and a base plate.

In the common power electronic module 15 of FIG. 1, the semiconductor devices 5, 6, 7, 8, are integrated on substrates 1, 2, whereby the devices 5, 6 are arranged on the substrate 1, and the devices 7, 8 are arranged on the substrate 2. The substrates 1, 2 are non conductive ceramics for voltage isolation, such as $Al_2O_3$, doped $Al_2O_3$, AlN or $Si_3N_4$, for example. For assembling and contacting the semiconductor devices 5, 6, 7, 8 on the substrates 1, 2, at least the upper sides of the ceramic substrates 1, 2 are metallized with Cu, Ni, Al or a similar material (metal layer 11). The metal layer 11 is connected with the ceramic substrate 1, 2 by means of a DCB (direct copper bonding) or an AMB (active metal brazing) process. A regular brazing type substrate may be used alternatively. In these kinds of metallization processes, metal layers with a roughness of about Rz=2-10 μm are created. The metal layer 11 may be divided into separate strip conductors by performing an additional etching process step for structuring of the layout of a desired circuit. Typically, layer thicknesses of the ceramic substrates 1, 2 range from 0.2 to 2.0 mm. Typical thicknesses of the metallization layers 11 range from 0.1 to 0.6 mm.

Often, a plurality of substrates 1, 2 is integrated in the module 15 on a metal base plate 9. In this case, a metallization 10 is likewise located on the rear side of the substrates 1, 2, for the production of a connection to the metallic base plate 9 by means of soft-soldering via the solder layers 12. A high thermal conductivity and a heat coefficient, which should be adapted to that of the substrates 1, 2, are desirable for the base plate 9. Cu and the composite material AlSiC are suitable materials for the base plate 9.

A housing 14 comprising a technical plastic is either glued to the base plate 9 or the substrates 1, 2. The housing 14 protects the electric components against outside meteorological influences and comprises silicon gel 16, with which the module 15 is typically cast. The silicon gel 16 ensures electric isolation within the module 15.

The semiconductor devices 5, 6, 7, 8 are connected to the metallization layers 11 on the substrates 1, 2, by soft-soldering with alloys such as Sn—Pb, Sn—Ag, Sn—Ag—Cu or other lead-free solder materials via solder layers 13. The connection of the metallic base plate 9 to the metallization layers 10 on the lower side of the substrates 1, 2 is also made—as mentioned above—by soft-soldering through the layers 12.

The low melting point of the solder alloys in the layers 12, 13 of 183° C. for $SnPb_{40}$ and 221° C. for $SnAg_{3.5}$, for example, eliminates a use under operating temperatures Tc of the devices 5, 6, 7, 8 at 175° C. At this temperature, the solder is operated too closely to its melting point, so that a sufficient thermal long-term stability cannot be guaranteed. In this case, the solder 13 is subjected to high stresses, caused by the changing thermal loads arising at the location of the devices 5, 6, 7, 8 during operation of the module 15. After a short period of time, cracks may form in the solder 13 leading to a breakdown of the devices 5, 6, 7, 8 caused by overheating.

The semiconductor devices 5, 6, 7, 8 are connected to the substrates 1, 2 by soft-soldering. At first, a solder paste 13 is applied to the substrate 1, 2 by template printing, ink jet methods or the like. Subsequently, the devices 5, 6, 7, 8 are automatically placed onto the solder past surfaces 13. Furthermore, the fitted substrates 1, 2 are automatically transported in a soldering furnace (vacuum continuous furnace, batch furnace, vapor-phase oven, etc.). There, heat is introduced into the substrates 1, 2 and the solder 13 is remelted. A reliable electrically and thermally stable connection is formed through the formation of an alloy at the boundary surfaces between the devices 5, 6, 7, 8 and the substrates 1, 2.

At operating temperatures of the devices 5, 6, 7, 8 of Tc=175° C. and above, the diffusion soldering provides an alternative technology. During diffusion soldering, a common soft solder is used. However, contrary to the paste-soldering, the target layer thickness is reduced from approximately 100 μm to several μm. With a sufficiently long soldering period, the entire solder is transferred into a high-melting intermetallic phase by means of alloy formation. Due to the fact that residual solder does not remain, a connection and contact layer having melting temperatures far above 200° C. is created.

Figure 2:
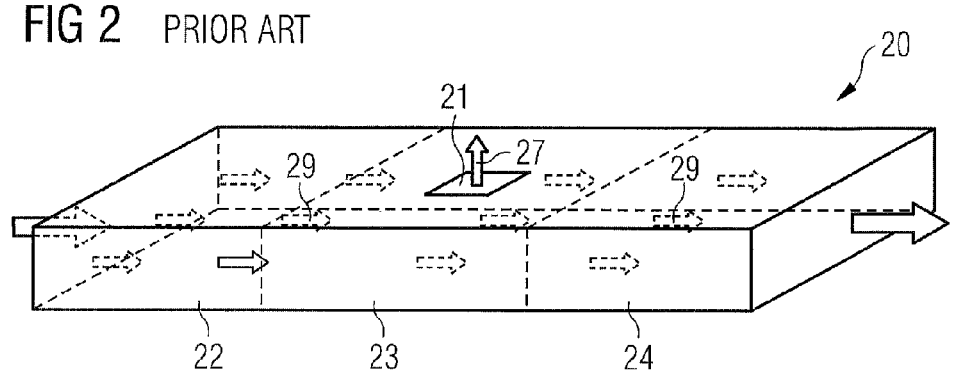
FIG. 2 is a schematic view of a common open heating channel with three sections.

FIG. 2 illustrates a common heating channel 20 for diffusion soldering of semiconductor components, which are inserted into the heating channel 20 through the opening 21 at the upper side of the heating channel 20. The (non-illustrated) components are soldered in the open heating channel 20 under a flowing forming and protective gas atmosphere 29 for a period of time t under a contact pressure F, so that a complete transfer of the solder is realized in a high-melting intermetallic phase. The heating channel 20, which is divided into three sections 22, 23, 24, leads to diffusion-soldered layers with thicknesses of between 1 and 20 μm. For a homogeneous flow of the protective gas 29 and for a minimization of the contamination of the protective gas flow 29 through the opening 21 into the heating channel 20, it is necessary to choose the surface of the opening 21 to be so small that the discharge 27 of the protective gas 29 only slightly disrupts the homogeneous flow of the protective gas 29.

Figure 3:
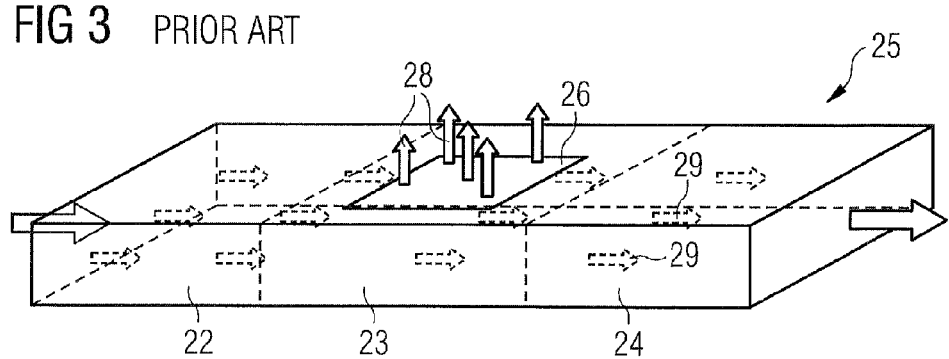
FIG. 3 is a schematic view of a common open heating channel with enlarged opening compared to FIG. 2.

Compared to the surface of the opening 21 of the heating channel 20 of FIG. 2, the heating channel 25 of FIG. 3 has an opening 26 with an enlarged surface. The opening 26 is suitable for soldering surfaces larger than 200 $mm^2$ and for a plurality of simultaneously diffusion-soldered components in the heating channel 25.

During diffusion-soldering of components with comparatively small soldering surfaces and correspondingly small openings 21, the channel can be constructed by generating of a suitable course of the flow of a protective gas 29 such that the oxygen contamination of the protective gas 29 through the opening 21 is kept below 100 ppm. Compared to the heating channel 20, the oxygen concentration in the heating channel 25 rises and assumes an increasingly undefined value. Furthermore, the protective gas 28, which escapes through the opening 26, leads to an increasingly inhomogeneous protective gas distribution within the heating channel 25, as compared with the heating channel 20. The result is an increased rate of hollow spaces inside the generated solder layer during diffusion-soldering, and a higher rate of dents at the surface of the solder layer.

Mechanical systems for diffusion-soldering of semiconductor components with solder surfaces of up to 200 $mm^2$ to metallized ceramic substrates with a roughness of Rz=2-10 μm with open heating channels are known, in which the components are placed and pressed on a substrate in two temporally and spatially separate steps. However, because the time between placing and pressing the component on the substrate is to be kept as short as possible during diffusion-soldering, a premature melting and an uncontrolled alloy formation of the solder can occur.

Furthermore, the open heating channels 20, 25 described in FIGS. 2 and 3 do not provide an opportunity to use aggressive media as activating atmosphere for the reduction of oxidized surfaces of the components. A subsequent and controlled reduction of oxidized surfaces, however, is desirable particularly during the processing of Cu surface areas having a high purity grade.

A vacuum-continuous apparatus for simultaneous, automatic diffusion soldering of a plurality of components on a plurality of substrates is illustrated in FIG. 4. In an example, the diffusion soldering plant 30 comprises three subchambers 40, 50, 60, which are separated from The devices 5, 6, 7, 8, which are to be connected, and the substrates 1, 2, which are to be connected, are displaced inside the chamber 30 on carrier systems 41, 42, which are separated from one another. One or a plurality of substrates 1, 2 are introduced on a first carrier system 41 into the subchamber 40 via the lock 32 and are heated to a first process temperature T1 via the heating plate 36 of the subchamber 40. One or a plurality of devices 5, 6, 7, 8 are located on a second carrier system 42, which also introduces the devices 5, 6, 7, 8 into the subchamber 40 of the diffusion chamber 30 by passing through the lock 32. The devices 5, 6, 7, 8 are heated to the process temperature T2 via the heating plate 37.

As shown, the direction of displacement of the devices 5, 6, 7, 8 and of the substrates 1, 2 is provided in a straight route through the chamber 30 (arrows 29). The carrier systems 41, 42 run parallel to one another continuously in longitudinal direction of the diffusion chamber 30 from the lock 32 to the lock 35.

Each subchamber 40, 50, 60 has a respective heating plate for the substrates and the devices. The substrates are thus heated to the temperature T3 using the heating plate 52 in the subchamber 50 and the devices are heated to the temperature T4 via the heating plate 51. The temperature T5 can be adjusted in the subchamber 60 via the heating plate 38. In case of displacement directions of the carrier systems 41, 42 opposite to one another, the temperature T6 of the devices 5, 6, 7, 8 is adjustable on the heating plate 39.

On the side facing the carrier system 42, the devices 5, 6, 7, 8 have a metallization, which may be diffusion soldered, and which, as a solder layer, establishes the connection to one or a plurality of substrates. Mechanical systems for evacuating the housing 31 of the diffusion soldering chamber 30 and inlets for gas media individually for each chamber 40, 50, 60 (not illustrated) provide for the desired atmosphere during the diffusion soldering process. For activating the free surface areas of the components, aggressive, acid gas media, for example, are introduced into the subchamber 50 prior to the soldering. Reducing media, such as formic acid, are used as activating media. Other activating media may be used as well.

A first gas exchange is affected in the subchamber 40, and a defined residual oxygen concentration between 1 and 1000 ppm is adjusted. After the end of the heating phase in the subchamber 40, which includes the heating of the substrates 1, 2 to the process temperature T1 and the heating of the devices 5, 6, 7, 8 to the process temperature T2, the substrates 1, 2 and the devices 5, 6, 7, 8 are displaced from the subchamber 40 into the subchamber 50 via the lock 33. An activating gas medium, for example formic acid, is introduced in the subchamber 50, to eliminate possible oxidic contaminations of the free surface areas of the devices 5, 6, 7, 8 and of the substrates 1, 2.

To minimize contaminations, which can permeate from the outside into the chamber 30 via the locks 32, 35, provision is made for a combined transfer and pressing unit 70 to be positioned in the center of the chamber 30.

Prior to the placing and pressing process of the devices 5, 6, 7, 8 on the substrates 1, 2, the devices 5, 6, 7, 8, as well as the substrates 1, 2 are displaced in positions, which permit a gripping of the devices 5, 6, 7, 8 by the transfer and pressing unit 70 and a placing and pressing of the devices 5, 6, 7, 8 on the substrates 1, 2. In the following, these positions are referred to as current positions. The combined transfer and pressing unit 70 is displaced between the current position of the devices 5, 6, 7, 8 and the current position of the substrates 1, 2. The combined transfer and pressing unit 70 grips the devices 5, 6, 7, 8, which are to be connected, travels between the current position of the devices 5, 6, 7, 8 and the current position of the substrates 1, 2, and deposits the devices 5, 6, 7, 8 on the substrates 1, 2. The transfer and pressing unit 70 thus simultaneously or consecutively removes the devices 5, 6, 7, 8 from the carrier system 42 and simultaneously or consecutively places the devices 5, 6, 7, 8 onto the positions of the substrates 1, 2 located on the first carrier system 41, which are to be connected.

Immediately after the placement of the devices 5, 6, 7, 8 on the current position of the substrates 1, 2, the transfer and pressing unit 70 homogeneously presses the devices 5, 6, 7, 8 on the substrate surface area with a defined pressure of between 0.1 to 5 N/mm². Naturally, it is also possible to place and press a respective device 5, 6, 7, 8 to a respective substrate 1, 2 by means of the transfer and pressing unit 70. Because of the formic acid applied in the subchamber 50 to the surface areas of the devices 5, 6, 7, 8 and of the substrate 1, 2, which are to be connected, the process temperature T3 in the subchamber 50 may be reduced.

After the transfer and pressing process, the fitted substrates 1, 2 are displaced into the subchamber 60 via the lock 34 to be cooled. For the clocking of further components, which are to be connected, the carrier system 42 also travels from the subchamber 50 into the subchamber 60 via the lock 34. In doing so, the heating phase, the transfer and pressing phase, as well as the cooling phase are effected in the subchambers 40, 50, 60. The substrates 1, 2 fitted with the devices 5, 6, 7, 8 are cooled to room temperature in the subchamber 60 and are discharged via the lock 35 from the diffusion soldering chamber 30 via the carrier system 41.

In an another example, the chamber comprises a plurality of juxtaposed subchambers 40, 50, 60, whereby each subchamber 40, 50, 60 comprises a medium and/or process temperature, which differs from that of the other subchambers. Particularly a division of the chamber 30 into three subchambers 40, 50, 60, as illustrated in FIG. 4, is advantageous, whereby a heating phase, a transfer and pressing phase, as well as a cooling phase of the devices 5, 6, 7, 8 is effected on the substrates 1, 2 in a respective subchamber 40, 50, 60. In response to a clocked continuous transport of the components, the heating phase, the transfer and pressing phase, as well as the cooling phase may proceed simultaneously to one another in the subchambers 40, 50, 60.

Optionally, the diffusion soldering chamber 30 with the three subchambers 40, 50, 60, as depicted in of FIG. 4, may be expanded by one or two chambers (not illustrated). A further chamber, in which the devices 5, 6, 7, 8 undergo a temperature treatment at a later point may be introduced behind the subchamber 50, for example. If the process in the subchamber 40 is a process-time-limited step, a chamber may furthermore be introduced following the subchamber 40, which permits a process time adaptation to the processes taking place in the subchambers 50 and 60.

In another example, the heating phase, the placing and pressing phase, and the cooling phase take place in only one chamber (not illustrated).

A diffusion soldering chamber 50 is illustrated in cross section in FIG. 5. The transfer and pressing unit 70 is displaced between the current position of the devices 5, 6 and the substrates 3, 4 (see double arrow). The transfer and pressing unit comprises a plurality of plungers 53, 54, 55, 56, which are each individually mounted in a movable and spring-mounted manner in the direction of the pressing direction of the devices 5, 6 on the substrates 3, 4 (not illustrated). The plunges 53, 54, 55, 56 are connected to one another via an elastic cell 58. A vacuum suction element or similar equipment is integrated in each plunge 53, 54, 55, 56 for receiving the devices 5, 6, so that the devices 5, 6 located on the carrier system 42 are securely received by the plunges 53, 54. In the embodiment illustrated in FIG. 5, the elastic cell 58 comprises an elastomer and, in response to the placing and pressing of the devices 5, 6, leads to a homogeneous contact pressure F of between 0.1 to 5 N/mm² on the upper side of the devices 5, 6, which is opposite to the lower side of the devices 5, 6, which is to be connected.

The devices 5, 6 are lifted via the plunges 53, 54 and are moved via the transfer and pressing unit 70, which is displaceable in the direction predefined by the positioning rail 59, between the current position of the devices 5, 6 and the current position of the substrates 3, 4, which permit a reception of the devices 5, 6 and a deposition of the devices 5, 6, on the substrates 3, 4, by means of the transfer and pressing unit 70. Individual temperatures for the substrates 3, 4 and for the devices 5, 6 are ensured by the heating plates 51, 52 below the carrier systems 41, 42.

The plunges 53, 54, 55, 56 deposit the devices 5, 6 on the predefined positions on the substrates 3, 4 with sufficient accuracy, so that a shifting or rearrangement of the devices 5, 6, is not necessary after the devices 5, 6 have been placed on the substrates 3, 4. Alternatively to a direction perpendicular to the direction of displacement of the carrier systems 41, 42, the placing and pressing unit may be displaced in a plane, which is located parallel to the plane mounted by the surface area of the carrier system 41. In this case, the position of a device 5, 6, which is to be applied, can be variably aligned on the positions on the substrates 3, 4 for the devices 5, 6.

FIG. 6 shows a further example of a placing and pressing unit 70 in cross section. As illustrated in FIG. 5, the plunges 53, 54, 55, 56 are displaced in the direction of the contact pressure F and comprise vacuum suction lines 73, 74, 75, 76, which discharge into vacuum suction elements 9, 10. The vacuum suction lines 73, 74, 75, 76 discharge into a supply line 77, which is connected to a vacuum reservoir, for example a vacuum pump (see Vak. in FIG. 6).

The plunges 53, 54, 55, 56 comprise a common rotatable element 72 for compensating a tilting between the (non-illustrated) substrates and the components to be connected. In response to a placing and pressing process of the components on the substrates, the rotatable element 72, which is located above or below the elastic cell 58 inside the tool base body 71, for example, leads to an angle between the normal of the lower sides of the components, which are to be connected, and the pressing direction of the components F. The angle corresponds to the angle between the normal of the substrate surface areas, which are to be connected, and the pressing direction F of the components. The plane of the substrate surface areas is schematically illustrated in FIG. 6 by means of the carrier system 42.

A further example of a transfer and pressing unit 80 is illustrated in FIG. 7, whereby the plunges 87 each comprise individual rotatable elements 83, 84, 85, 86. The rotatable elements 82, 83, 84, 85, 86 may each comprise cardanic elements. As is the case in FIG. 6, the suction lines of the plunges 87 herein are also connected to one another via the supply line 77, which leads to a vacuum reservoir.

A variable force F, which is redirected into the devices 5, 6 via the plunges 53, 54, 55, 56, is injected by the transfer and pressing unit. The introduction of the force into the devices 5, 6 plays a central part for the production of solder layers with thicknesses of a few μm. Care has to be taken to completely alloy the solder layers in the shortest possible time. To be able to compensate for differences in levels between the different devices 5, 6, and to be able to inject the same forces to all of the devices 5, 6, the transfer and pressing unit comprises plunges, which are mounted in the tool base body 57 in a movably and spring-loaded manner in the direction of the pressing force F.

A further exemplary arrangement of the haltering of the plunges 53, 54, 55 in the tool base body 57 is illustrated in the transfer and pressing unit 90 of FIG. 8. Instead of the elastic cell 58, which comprises an elastomer, the guided plunges 53, 54, 55, are connected to one another via a liquid 91 and via a flexible membrane 92, which seals the liquid.

Another variant of the flexible storing of the plunges 53, 54, 55 in the tool base body 102 of the transfer and pressing unit 100 is illustrated in FIG. 9. The plunges 53, 54, 55 are individually connected to the tool base body 102 via spring elements 101. Naturally, elastic cells, which individually connect the plunges 53, 54, 55 to the tool base body 102, may also be used instead of the spring elements 101. Possible differences in the levels between the devices 5, 6 are compensated for by compression of the spring-mounting of the plunges 53, 54, 55 and the force F is evenly introduced into the devices 5, 6 and the substrates 3, 4 via the plunges 53, 54, 55. The substrates 3, 4 are thereby maintained on the process temperature T3 until the entire soft solder is alloyed and is located exclusively in the metallic phases in the solder connection layer.

Figure 10:
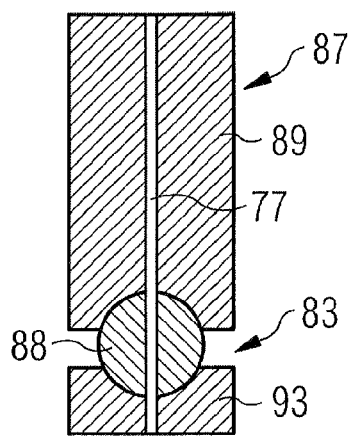
FIG. 10 is a cross sectional view of one of the plunges of FIG. 7, whereby the rotatable element comprises a cardanic element.
Figure 11:
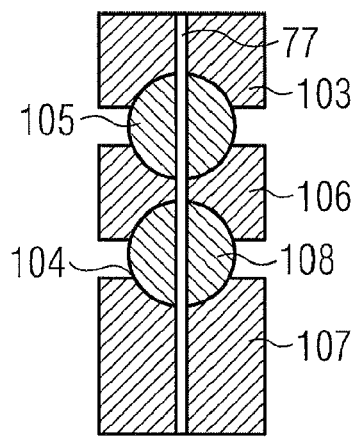
FIG. 11 is a cross sectional view of another of the plunges of FIG. 7, whereby the rotatable element comprises two cardanic elements being connected in series.

Different variants of the rotatable elements 82, 83, 84, 85, 86 are illustrated in FIGS. 10 and 11. The plunges schematically illustrated in FIGS. 10 and 11 each comprise suction lines 77. The plunge 87 only comprises one cardanic element 83. The cardanic element 83 comprises a sphere 88, which is encompassed by the part 89 above the sphere 88 and the part 93 below the sphere 88. The rotatable element 83, in response to the placing and pressing process of the device 5 on the substrate 3 by the plunge 87, assumes an angle between the normal 95 of the lower side of the device 5 to be connected and the pressing direction F of the device 5, the angle corresponding to the angle between the normal 96 of the surface area of the substrate 3 to be connected and the pressing direction F of the device 5. A possible tilting of the lower side of the device 5 in reference to the substrate surface area, which is to be connected, is individually compensated for by the rotatable element 83. A parallel alignment of the device 5 to the substrate 3 leads to a constant thickness of the solder layer 13.

The upper and lower ends of the suction line 77 in the sphere 88 may each be widened to a funnel having an angle corresponding to the tilting angle of the lower side of the device 5 in reference to the surface area of the substrate 3. An example of a funneled lower end of the suction line 77 in the sphere 88 at the intersection to the part 93 below the sphere 88 is shown in FIG. 10. The lower end of the part 89 above the sphere 88 and the upper end of the part 93 below the sphere 88 may be equipped with suction funnels as well.

It can be seen from FIG. 10 that in the variant of the storing of the plunge 87, an offset develops between the device 5, 6 and the substrate 3, 4 during the pressing in response to a compensation of a tilting. The offset is minimized when the center of the spherical element 83 lies as close to the ideal pivot point as possible, which is located in the surface area of the device 5, 6 to be connected. As illustrated in FIG. 10, the center of the sphere 83 may be located at the lower end of the plunge 87.

An offset between the device 5, 6 and the substrate 3, 4 as a result of a compensation of a possible tilting is prevented by arranging at least two cardanic elements one after the other in the plunge 104 in FIG. 11. The placing point of the lower side of the plunge 107 on the device 5, 6 does not change during the pressing process on the substrate 3, 4, due to the cardanic elements arranged in series. Naturally, more than two cardanic elements may be connected in series. The upper cardanic element comprises the sphere 105, the upper part 103, and the lower part 106. The lower cardanic element comprises the sphere 108, the lower part of the upper cardanic element 106 being the upper part of the lower cardanic element. The lower cardanic element is locked by the lower part 107.

Figure 12:
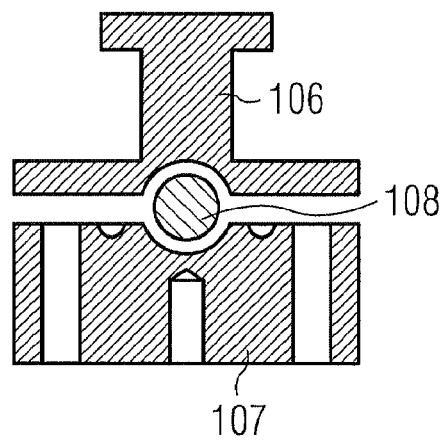
FIG. 12 is a cross section view of a cardanic element with a sphere, an upper part, and a lower part.

A further example of a cardanic element is illustrated in FIGS. 12, 13, and 14. FIG. 12 shows the assembled cardanic element, which comprises the sphere 108, the upper part 106, and the lower part 107. FIG. 13 shows an example of the lower part 107, wherein the vacuum suction lines for receiving the devices 5, 6 are visible. The upper part 106 is illustrated in detail in FIG. 14. The sphere 108 is positioned between the upper and the lower parts 106 and 107 by means of guide screws. In doing so, the lower part 107 can freely align itself with reference to the surface area of the substrate 3, 4 which is to be connected.

During diffusion soldering, for example for connecting IGBT or MOSFET devices (IGBT: insulated gate bipolar transistor, MOSFET: metal oxide semiconductor field effect transistor) with DCB or AMB substrates, tiltings of between 1 to 20 μm of the substrate surface area, which is to be connected, and of the lower side of the component, which is to be connected, occur. Particularly the combined use of a rotatable element for compensating tiltings and of a spring-mounted plunge, permit a complete compensation of the tilting between the devices 5, 6 and the substrates 3, 4 in response to a homogeneous introduction of a contact pressure F on the devices 5, 6, which are to be connected with the substrates 3, 4, so that excessive residual solder can be pressed out of the gaps between the devices 5, 6 and the substrates 3, 4 during diffusion soldering. An alloying of the entire soft solder with the result of exclusively intermetallic phases in the solder connection layer can thus be reliably achieved.

The apparatus of the novel connection arrangement permits diffusion soldering of components on substrates by virtue of a highly reduced oxidation of the free surfaces of the components. For this purpose, the diffusion-soldering of semiconductor components on ceramic substrates is affected in a closed evacuated installation. The result thereof is the possibility of adjusting a defined oxygen concentration by a gas exchange in the context of the transport of the components and of the substrates from a subchamber of the novel chamber into another subchamber. Furthermore, other reducing activation media (such as formic acid) may be used in addition to the forming and protective gas. While the forming gas guarantees a sufficient chemical surface area activation only at temperatures of approximately 400° C., formic acid already has an activating effect at 170° C.

A combined transfer and pressing unit is located in the closed evacuated chamber, with which the semiconductor components to be connected are received from a storage position and are deposited onto the solder position, at which the substrate to be connected is located. During the deposition, a force is exerted on the semiconductor components by the pressing unit, so that the time between the placement and pressing of the semiconductor components on the substrates to be connected is minimized.

With solder thicknesses of a few micrometers, such as created during diffusion soldering, a tilting or wedge-formation in the solder layer, which is to be applied, may lead to an uncontrolled formation of hollow spaces inside the solder layer and to dents at the solder layer surface areas. This leads to a degradation of the solder connection layer between component and substrate. During the process of placing and pressing the component on the substrate, an angle appears between the normal of the lower side of the component, which is to be connected, and the pressing direction of the component. The angle corresponds to the angle between the normal of the substrate surface area, which is to be connected, and the pressing direction of the component. This way, tiltings and wedge-formations are avoided in the solder layer to be applied.

What is claimed is:

1. An apparatus for connecting a component with a substrate by means of diffusion soldering in a closed evacuated chamber, wherein the component and the substrate to be connected are displaceable separate from one another in the chamber, and the chamber comprises a first carrier system operable to introduce the component into the chamber and a second carrier system operable to introduce the substrate into the chamber, the first and second carrier systems being separated from one another and running parallel to one another along a longitudinal direction of the chamber, the chamber further comprising a combined transfer and pressing unit being displaceable between a current position of the component and a current position of the substrate, for placing and pressing the component on the substrate, and the combined transfer and pressing unit comprises a rotatable element, which, in response to the placing and pressing of the component on the substrate, assumes an angle between the normal of a lower side of the component to be connected and a pressing direction of the component, the angle corresponding to an angle between the normal of a surface area of the substrate to be connected and the pressing direction of the component, wherein the combined transfer and pressing unit is operable to grip the component arranged on the second carrier system and place the component on the substrate arranged on the first carrier system.

2. The apparatus according to claim 1, wherein a plurality of components, a plurality of substrates and a plurality of rotatable elements are located in the chamber at the same time.

3. The apparatus according to claim 1, wherein the surface area to be connected of each substrate is covered with formic acid.

4. The apparatus according to claim 1, wherein the chamber comprises three juxtaposed subchambers.

5. The apparatus according to claim 4, wherein each of the juxtaposed subchambers comprises process parameters which differ from those of the other subchambers.

6. The apparatus according to claim 1, wherein the subchambers are connected to one another and with respect to the outside by means of two carrier systems, wherein the substrate is placed on the first carrier system and displaced through the chambers and the component is placed on the second carrier system and displaced through the chambers.

7. The apparatus according to claim 1, wherein the transfer and pressing unit comprises at least one plunge, wherein each plunge has a vacuum suction element for gripping at least one component.

8. The apparatus according to claim 7, wherein the at least one plunge is individually mounted in a movable and spring-mounted manner in a direction of the pressing direction of the component.

9. The apparatus according to claim 8, wherein each plunge is individually connected to a plunge carrier by a spring element, or to the plunge carrier by an elastic cell.

10. The apparatus according to claim 8, wherein a plurality of plunges are connected to one another by an elastic cell.

11. The apparatus according to claim 9, wherein the elastic cell comprises an elastomer.

12. The apparatus according to claim 9, wherein the elastic cell comprises a liquid and a flexible membrane, which seals the liquid.

13. The apparatus according to claim 7, wherein each plunge comprises an element for compensating a tilting between the substrate and the component.

14. The apparatus according to claim 7, wherein a plurality of plunges comprise a shared element for compensating a tilting between the substrates and the components.

15. The apparatus according to claim 13, wherein the element comprises a cardanic element for compensating a tilting between the substrate and the component.

16. The apparatus according to claim 15, wherein the cardanic element comprises a sphere, an upper part and a lower part, wherein the sphere is arranged between the upper part and the lower part and is mounted with guide screws.

17. The apparatus according to claim 1, wherein the at least one component is an IGBT or MOSFET.

18. The apparatus according to claim 1, wherein the at least one substrate is a DCB (direct copper bonding) substrate, an AMB (active metal brazing) substrate, or a regular brazing type substrate.

19. An apparatus for connecting a component with a substrate, the apparatus comprising:
a closed evacuated chamber in which the component and the substrate to be connected are displaceable separate from one another, the closed evacuated chamber comprising:
a combined transfer and pressing unit operable to displace between a current position of the component and a current position of the substrate and operable to place and press the component on the substrate, the combined transfer and pressing unit comprising:
a rotatable element, which, in response to the placing and pressing of the component on the substrate, is operable to assume an angle between the normal of a lower side of the component to be connected and a pressing direction of the component, the angle corresponding to an angle between the normal of the substrate surface area to be connected and the pressing direction of the component;
a first carrier system operable to introduce the component into the closed evacuated chamber; and
a second carrier system operable to introduce the substrate into the closed evacuated chamber, the first and second carrier systems being separated from one another and running parallel to one another along a longitudinal direction of the chamber;
wherein the combined transfer and pressing unit is further operable to grip the component arranged on the second carrier system and place the component on the substrate arranged on the first carrier system.

20. The apparatus of claim 19, wherein the first and second carrier systems are operable to run parallel to one another inside the closed evacuated chamber between first and second locks operable to seal off the closed evacuated chamber to the outside.

* * * * *

UNITED STATES PATENT AND TRADEMARK OFFICE
CERTIFICATE OF CORRECTION

| | |
|---|---|
| PATENT NO. | : 8,104,667 B2 |
| APPLICATION NO. | : 12/844170 |
| DATED | : January 31, 2012 |
| INVENTOR(S) | : Karsten Guth et al. |

It is certified that error appears in the above-identified patent and that said Letters Patent is hereby corrected as shown below:

Title Page

Please correct the following field of the granted patent as follows:

(75)  Inventors:   Karsten Guth, Soest (DE); Alfred Kemper, Warstein (DE); Roland Speckels, Kamen (DE)

Signed and Sealed this
Sixth Day of November, 2012

David J. Kappos
*Director of the United States Patent and Trademark Office*